United States Patent
Tada et al.

[11] Patent Number: 5,998,046
[45] Date of Patent: Dec. 7, 1999

[54] GREEN LIGHT EMITTING ORGANIC THIN FILM ELECTROLUMINESCENT DEVICE

[75] Inventors: Hiroshi Tada; Hiroyuki Endoh; Akira Hirano; Koji Utsugi, all of Tokyo, Japan

[73] Assignee: NEC Corporation, Tokyo, Japan

[21] Appl. No.: 08/968,297

[22] Filed: Nov. 12, 1997

[30] Foreign Application Priority Data

Nov. 11, 1996 [JP] Japan .................................. 8-298920

[51] Int. Cl.$^6$ .................................................. H05B 33/13
[52] U.S. Cl. ........................ 428/690; 428/691; 428/917; 313/504
[58] Field of Search ................... 428/690, 691, 428/917; 313/504

[56] References Cited

U.S. PATENT DOCUMENTS 3,180,730 4/1965 Klupfel et al. .
5,891,587 4/1999 Hu et al. .................................. 428/690

FOREIGN PATENT DOCUMENTS 63-295695 12/1988 Japan .

OTHER PUBLICATIONS

The 57th Applied Physics Society Lecture Pre–Publication Series vol. 3 8–P–ZM–7, p. 1023, Sep. 7, 1996.
C.W. Tang et al., "Organic electroluminescent diodes", pp. 913–915, Appl. Phys. Lett., vol. 51, No. 12, Sep. 21, 1987.
Chihaya Adachi, et al., "Blue light–emitting organic electroluminescent devices", pp. 799–801, Appl. Phys. Lett., vol. 56, No. 9, Feb 26, 1990.

(List continued on next page.)

*Primary Examiner*—Charles Nold
*Attorney, Agent, or Firm*—Young & Thompson

[57] ABSTRACT

An organic thin film electroluminescent device has at least an organic thin film provided between an anode and a cathode,
wherein the organic thin film includes a compound which is represented by a general formula (I):

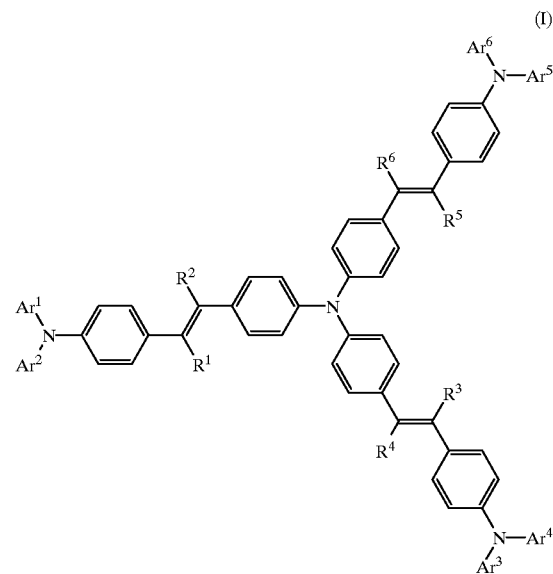

where $Ar^1$, $Ar^2$, $Ar^3$, $Ar^4$, $Ar^5$, and $Ar^6$ are selected from the group consisting of non-substituted phenyl groups and phenyl groups substituted with at least a substituent which is selected from the group consisting of alkyl groups having 1–4 carbon atoms, alkoxyl groups having 1–4 carbon atoms, amino groups, alkyl amino groups having 1–4 carbon atoms, dialkyl amino groups having 1–4 carbon atoms, alkyl thio groups having 1–4 carbon atoms, halogens, and halogeno alkyl groups having 1–4 carbon atoms, and $R^1$, $R^2$, $R^3$, $R^4$, $R^5$, and $R^6$ are selected from the group consisting of hydrogen and methyl groups.

20 Claims, 1 Drawing Sheet

OTHER PUBLICATIONS

Masamichi Fujihira et al., "Growth of dark spots by inter-diffusion across organic layers in organic electroluminescent devices", pp. 1787–1789, Appl. Phys. Lett. vol. 68, No. 13, Mar. 25, 1996.

Yasuhiko Shirota et al., "Multilayered organic electroluminescent device using a novel starburst molecule, 4,4',4"–tris (3–methylphenylphenylamino triphenylamine, as a hole transport material", pp. 807–809, Appl. Phys. Lett. vol. 65, No.7, Aug. 15, 1994.

GREEN LIGHT EMITTING ORGANIC THIN FILM ELECTROLUMINESCENT DEVICE

BACKGROUND OF THE INVENTION

The present invention relates to a light-emitting organic thin film electroluminescent device usable for a flat light emission panel and display.

The organic thin film electroluminescent device is attracted as a self-light-emitting plane display. The organic thin film electroluminescent device has laminations of organic layers which have different functions for the purpose of remarkable improvement in emission efficiency. The organic thin film electroluminescent device may show a high brightness of luminescence by a voltage which is slightly less than 10V. This organic thin film electroluminescent device is, for example, disclosed in Applied Physics Letters Vol. 51, 1987, p. 913 and Vol. 56, 1990, p. 799. The most of the organic thin film electroluminescent devices has a multi-layered structure of anode/hole transport region/electroluminescent emitter region/electron transport region/cathode. Any one or both of the hole transport region and the electron transport region might not be provided. The hole transport region may comprises a first hole transport layer which allows a hole injection from the anode into the electroluminescent emitter region, and a second hole transport layer which serves as a blocking layer against electrons and excitons supplied from the electroluminescent emitter region.

The hole transport region of the conventional organic thin film electroluminescent device may mostly comprise an aromatic amine formed by evaporation. Particularly, 1,1'-bis(4-diparatrilaminophenyl)cyclohexene or N,N'-diphenyl-N,N'-bis(3-methylphenyl)-1,1'-biphenyl-4,4'-diamine are preferable for materials of the evaporated film due to those excellent hole injection property and good film growth property. Those evaporated film is uniform immediately after the evaporation. After a few days, however, cohesion may appear. This cohesion deteriorates the properties of the device. This is disclosed in Applied Physics Letters, Vol. 68, 1996, p. 1787.

In Japanese laid-open patent publication No. 57-51781, it is disclosed that a porphyrin compound is used for the hole transport layer in the organic thin film electroluminescent device. After the organic thin film electroluminescent device has been formed, then the hole transport layer shows crystallization and cohesion which causes deterioration in property of the device.

In Japanese laid-open patent publication No. 7-110940 as well as Applied Physics Letters Vol. 65, 1994, p. 807, it is disclosed to use ternary amine of Star-Burst type for the hole transport layer. It is, however, difficult to obtain a sufficiently long durability of highly bright luminescence.

In Japanese laid-open patent publication No. 63-295695, it is disclosed that, in order to reduce pin holes for improvement in stability of the organic thin film electroluminescent device, the hole transport layer has a double-layered structure of a first layer of porphyrin based compound for allowing hole injection from the anode and a second layer of aromatic ternary amine. It is, however, difficult to obtain a sufficient improvement in stability of the organic thin film electroluminescent device.

As described above, the organic thin film electroluminescent device shows a high brightness of luminance but has a shorter life-time than other luminescent devices. This short life-time makes it difficult to make the organic thin film electroluminescent device practicable.

In the above circumstances, it had been required to develop a novel organic thin film electroluminescent device having a longer life-time than the conventional ones for enabling the organic thin film electroluminescent device practicable.

SUMMARY OF TH INVENTION

Accordingly, it is an object of the present invention to provide a novel organic thin film electroluminescent device having a long life-time for enabling the organic in film electroluminescent device practicable.

The above and other objects, features and advantages of the present invention will be apparent from the following descriptions.

The present invention provides an organic thin film electroluminescent device which has at least an organic thin film provided between an anode and a cathode, wherein said organic thin film includes a compound which is represented by a general formula (I):

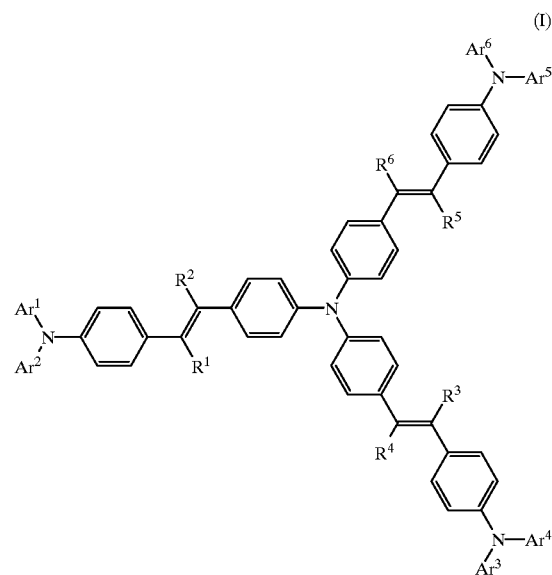

where $Ar^1$, $Ar^2$, $Ar^3$, $Ar^4$, $Ar^5$, and $Ar^6$ are selected from the group consisting of non-substituted phenyl groups and phenyl groups substituted with at least a substituent which is selected from the group consisting of alkyl groups having 1–4 carbon atoms, alkoxyl groups having 1–4 carbon atoms, amino groups, alkyl amino groups having 1–4 carbon atoms, dialkyl amino groups having 1–4 carbon atoms, alkyl thio groups having 1–4 carbon atoms, halogens, and halogeno alkyl groups having1–4 carbon atoms, and $R^1$, $R^2$, $R^3$, $R^4$, $R^5$, and $R^6$ are selected from the group consisting of hydrogen and methyl groups.

BRIEF DESCRIPTION OF THE DRAWINGS

Preferred embodiments according to the present invention will be described in detail with reference to the accompanying drawings.

DISCLOSURE OF THE INVENTION

Figure 1:
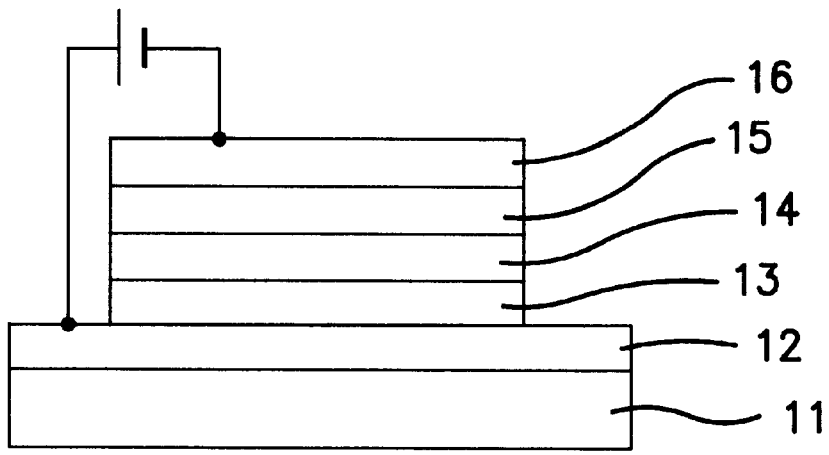
FIG. 1 is a cross sectional elevation view illustrative of a novel organic thin film electroluminescent device in accordance with the present invention.

The present invention provides an organic thin film electroluminescent device which has at least an organic thin film provided between an anode and a cathode, wherein said organic thin film includes a compound which is represented by a general formula (I):

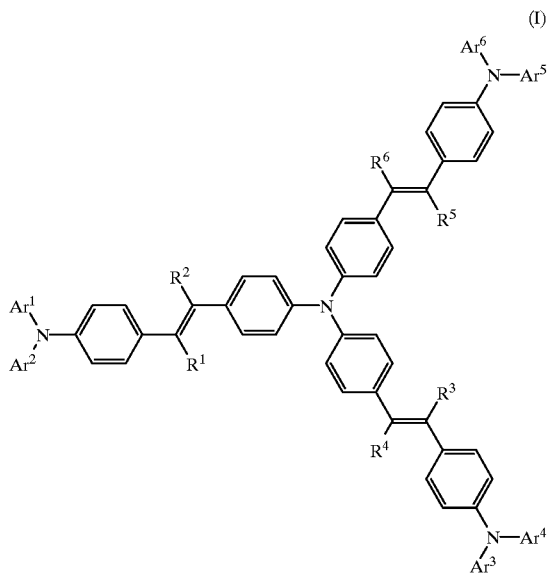

where $Ar^1$, $Ar^2$, $Ar^3$, $Ar^4$, $Ar^5$, and $Ar^6$ are selected from the group consisting of non-substituted phenyl groups and phenyl groups substituted with at least a substituent which is selected from the group consisting of alkyl groups having 1–4 carbon atoms, alkoxyl groups having 1–4 carbon atoms, amino groups, alkyl amino groups having 1–4 carbon atoms, dialkyl amino groups having 1–4 carbon atoms, alkyl thio groups having 1–4 carbon atoms, halogens, and halogeno alkyl groups having 1–4 carbon atoms, and $R^1$, $R^2$, $R^3$, $R^4$, $R^5$, and $R^6$ are selected from the group consisting of hydrogen and methyl groups.

The phenyl group may be substituted with a plurality of the same substituents as each other, or a plurality of different substituents from each other.

The compounds represented by the above general formula (I) have extremely good properties of growth in the form of film and have a strong property as amorphous so that cohesion is unlikely to appear, for which reason the organic thin film including the compound represented by the above general formula (I) has a high stability for enabling the organic thin film electroluminescent device to have an excellent durability.

The compound represented by the above general formula (I) is included in the organic thin film preferably at 10–100% by weight, and more preferably at 50–100% by weight. The thickness of the organic thin film including the compound represented by the above general formula (I) is preferably 1–500 nanometers and more preferably 2–100 nanometers. If the organic thin film including the compound represented by the above general formula (I) is too thick, then a high driving voltage is required for driving the organic thin film electroluminescent device. Since the organic thin film electroluminescent device is a current-injection luminescent device, the high driving voltage causes a large heat generation in the organic thin film electroluminescent device. Such large heat generation deteriorates the organic thin film electroluminescent device.

The compound represented by the above general formula (I) is used in order to provide a high stability to the organic thin film in the organic thin film electroluminescent device. It has been known that an organic material having a skeleton of tris-styryl-triphenyl amine shows a high charge transfer. For example, high charge transfer of a charge transport layer in a photo-sensitive element is required for the increase in printing speed of an electro-photographic printer, because the thickness of the charge transport layer is generally thick, for example, several tens micrometers in the light of wear and abrasion resistance, for which reason field effect transfer process in the charge transport layer limits the printing speed. The organic thin film of die electroluminescent device has a thickness smaller by one-digit or more than that of the above electrophotographic printer, for which reason it is required for the electroluminescent device that cohesion is unlikely to appear in the organic film and the organic film has a sufficient adhesiveness with a substrate for high durability of the organic layer. The high durability of the organic layer is important because a high electric field is applied to the extremely thin film for driving the electroluminescent device. The compound represented by the above general formula (I) has a strong property as amorphous such that cohesion is unlikely to appear in the organic film including the compound and such organic film has a good adhesiveness with the substrate. As a result, the durability of the organic thin film electroluminescent device is improved.

The organic film including the compound represented by the above general formula (I) may be grown by the known methods such as evaporation methods, for example, resistance heating method, electron beam method, sputtering method, ion-plating method, and molecular beam epitaxy method.

Alternatively, wet growth methods are also available such as spin coater, spray coater, bar coater, dip coater, doctor blade and roller coater.

In this case, known solvents such as alcohols, aromatic hydrocarbons, ketones, esters, aliphatic halogenated hydrocarbon, ethers, amides, sulfoxides are available for preparation of coating solution.

It is also available that a low molecular weight compound represented by the above general formula (I) is dispersed in a high molecular binder for formation of the organic film. The high molecular binder may be selected from known materials such as vinyl resins, acryl resins, epoxy resins, silicone resins, styryl resins, polyimide, polysilylene, polyvinyl carbazole, polycarbonate, cellulose resins, and polyolefin resins, as well as natural resins such as glue and gelatin.

The above high molecular binder dispersion film may be grown by the known methods, for example, it is possible that the high molecular binder is solved in the solvent for carrying out the wet film growth method as described above.

Examples of the compounds represented by the above general formula (I) are shown on the following Tables 1–6 but those are not intended to be limiting sense.

TABLE 1

| compound | Ar¹ | Ar² | Ar³ |
|---|---|---|---|
| 1 | 4-CH₃-C₆H₄- | 4-CH₃-C₆H₄- | 4-CH₃-C₆H₄- |
| 2 | 4-CH₃-C₆H₄- | 4-CH₃-C₆H₄- | 4-CH₃-C₆H₄- |
| 3 | 4-C₂H₅-C₆H₄- | C₆H₅- | 4-C₂H₅-C₆H₄- |
| 4 | 3-CH₃-C₆H₄- | C₆H₅- | 3-CH₃-C₆H₄- |
| 5 | 3,4-(CH₃)₂-C₆H₃- | C₆H₅- | 3,4-(CH₃)₂-C₆H₃- |
| 6 | 4-iPr-C₆H₄- | C₆H₅- | 4-iPr-C₆H₄- |
| 7 | 4-CH₃-C₆H₄- | 4-CH₃-C₆H₄- | 4-CH₃-C₆H₄- |
| 8 | 4-CH₃-C₆H₄- | C₆H₅- | 4-CH₃-C₆H₄- |

| compound | Ar⁴ | Ar⁵ | Ar⁶ |
|---|---|---|---|
| 1 | 4-CH₃-C₆H₄- | 4-CH₃-C₆H₄- | 4-CH₃-C₆H₄- |
| 2 | C₆H₅- | 4-CH₃-C₆H₄- | C₆H₅- |
| 3 | C₆H₅- | 4-C₂H₅-C₆H₄- | C₆H₅- |

TABLE 1-continued
| compound | Ar¹ | Ar² | Ar³ |
|---|---|---|---|
| 4 | 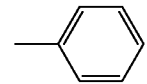 | 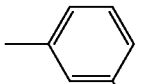 | 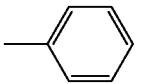 |
| 5 | 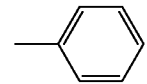 | 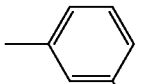 | 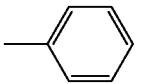 |
| 6 | 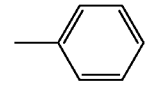 | 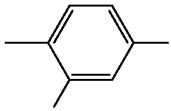 | 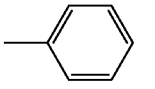 |
| 7 | 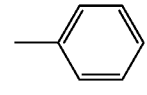 | 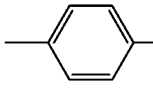 | 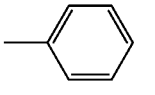 |
| 8 | 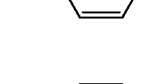 | 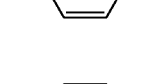 | 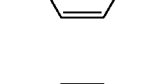 |
| compound | $R^1$ | $R^2$ | $R^3$ | $R^4$ | $R^5$ | $R^6$ |
|---|---|---|---|---|---|---|
| 1 | H | H | H | H | H | H |
| 2 | H | H | H | H | H | H |
| 3 | H | H | H | H | H | H |
| 4 | H | H | H | H | H | H |
| 5 | H | H | H | H | H | H |
| 6 | H | H | H | H | H | H |
| 7 | H | $CH_3$ | H | $CH_3$ | H | $CH_3$ |
| 8 | H | $CH_3$ | H | $CH_3$ | H | $CH_3$ |
TABLE 2
| compound | Ar¹ | Ar² | Ar³ |
|---|---|---|---|
| 9 | 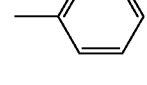 | 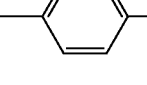 | 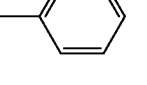 |
| 10 | 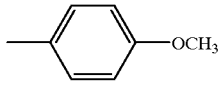 | 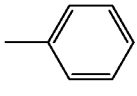 | 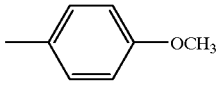 |
| 11 | 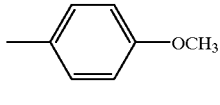 | 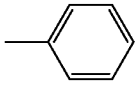 | 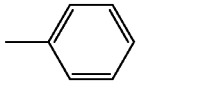 |
| 12 | 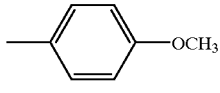 | 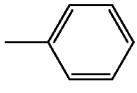 | 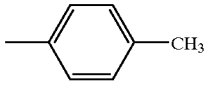 |

TABLE 2-continued

| compound | Ar⁴ | Ar⁵ | Ar⁶ |
|---|---|---|---|
| 13 | —C₆H₄—OC₂H₅ | —C₆H₅ | —C₆H₄—OC₂H₅ |
| 14 | —C₆H₄—OCH₃ | —C₆H₅ | —C₆H₄—OCH₃ |
| 15 | —C₆H₄—OCH₃ | —C₆H₅ | —C₆H₅ |
| 16 | —C₆H₄—OCH₃ | —C₆H₅ | —C₆H₄—CH₃ |

| compound | Ar⁴ | Ar⁵ | Ar⁶ |
|---|---|---|---|
| 9 | —C₆H₅ | —C₆H₄—OCH₃ | —C₆H₅ |
| 10 | —C₆H₅ | —C₆H₅ | —C₆H₅ |
| 11 | —C₆H₅ | —C₆H₄—CH₃ | —C₆H₅ |
| 12 | —C₆H₅ | —C₆H₅ | —C₆H₅ |
| 13 | —C₆H₅ | —C₆H₅ | —C₆H₅ |
| 14 | —C₆H₅ | —C₆H₄—OCH₃ | —C₆H₅ |
| 15 | —C₆H₅ | —C₆H₅ | —C₆H₅ |
| 16 | —C₆H₅ | —C₆H₄—CH₃ | —C₆H₅ |

| compound | $R^1$ | $R^2$ | $R^3$ | $R^4$ | $R^5$ | $R^6$ |
|---|---|---|---|---|---|---|
| 9 | H | H | H | H | H | H |
| 10 | H | H | H | H | H | H |
| 11 | H | H | H | H | H | H |
| 12 | H | H | H | H | H | H |
| 13 | H | H | H | H | H | H |
| 14 | H | CH₃ | H | CH₃ | H | CH₃ |

TABLE 2-continued
| | | | | | | | |
|---|---|---|---|---|---|---|---|
| | 15 | H | CH$_3$ | H | CH$_3$ | H | CH$_3$ |
| | 16 | H | CH$_3$ | H | CH$_3$ | H | CH$_3$ |
TABLE 3
| compound | Ar$^1$ | Ar$^2$ | Ar$^3$ |
|---|---|---|---|
| 17 | 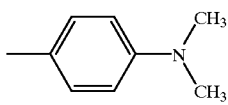 | 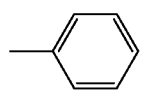 | 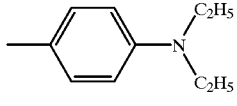 |
| 18 | 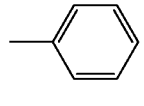 | 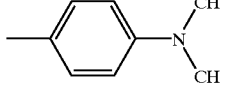 | 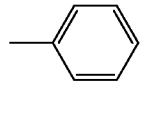 |
| 19 | 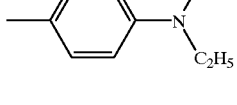 | 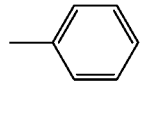 | 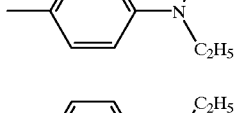 |
| 20 | 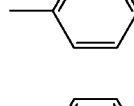 | 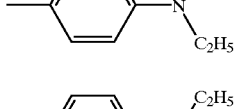 | 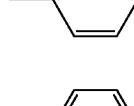 |
| 21 | 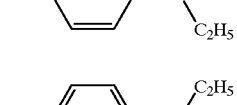 | 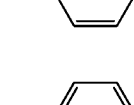 | 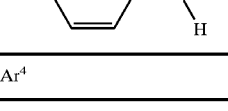 |
| 22 | 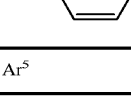 | 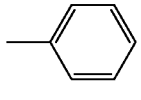 | 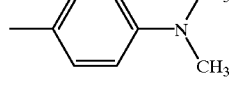 |
| 23 | 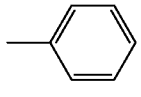 | | |
| 24 | 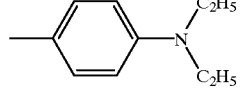 | | |
| compound | Ar$^4$ | Ar$^5$ | Ar$^6$ |
|---|---|---|---|
| 17 | | 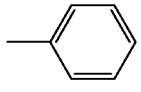 | |
| 18 | | 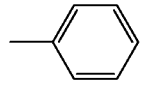 | |
| 19 | | | |

TABLE 3-continued
| compound | Ar¹ | Ar² | Ar³ |
|---|---|---|---|
| 20 | 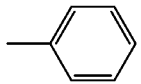 | 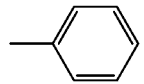 | 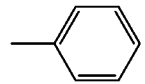 |
| 21 | 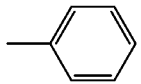 | 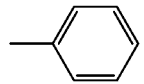 | 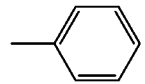 |
| 22 | 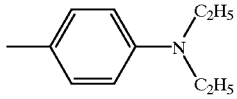 | 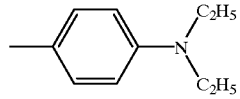 | 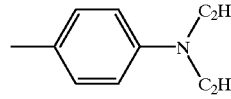 |
| 23 | 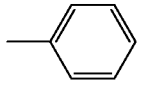 | 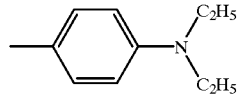 | 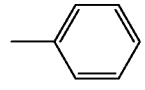 |
| 24 | 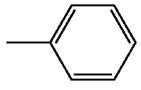 | 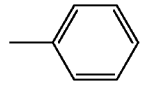 | 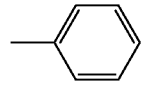 |
| compound | $R^1$ | $R^2$ | $R^3$ | $R^4$ | $R^5$ | $R^6$ |
|---|---|---|---|---|---|---|
| 17 | H | H | H | H | H | H |
| 18 | H | H | H | H | H | H |
| 19 | H | H | H | H | H | H |
| 20 | H | H | H | H | H | H |
| 21 | H | H | H | H | H | H |
| 22 | H | $CH_3$ | H | $CH_3$ | H | $CH_3$ |
| 23 | H | $CH_3$ | H | $CH_3$ | H | $CH_3$ |
| 24 | H | $CH_3$ | H | $CH_3$ | H | $CH_3$ |
TABLE 4
| compound | Ar¹ | Ar² | Ar³ |
|---|---|---|---|
| 25 | 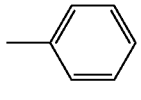 | 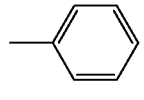 | 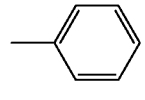 |
| 26 | 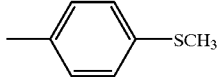 | 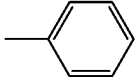 | 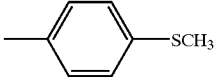 |
| 27 | 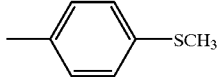 | 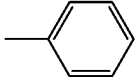 | 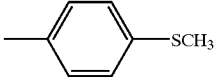 |
| 28 | 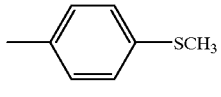 | 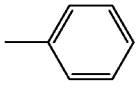 |  |
| 29 | 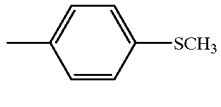 | 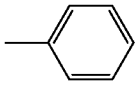 | 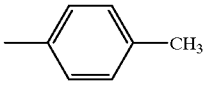 |
| 30 | 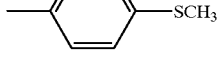 | 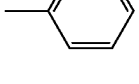 | 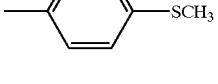 |

TABLE 4-continued

| compound | Ar¹ | Ar² | Ar³ |
|---|---|---|---|
| 31 | 4-Cl-C₆H₄ | C₆H₅ | C₆H₅ |
| 32 | 2,4-Cl₂-C₆H₃ | C₆H₅ | C₆H₅ |

| compound | Ar⁴ | Ar⁵ | Ar⁶ |
|---|---|---|---|
| 25 | C₆H₅ | 4-SCH₃-C₆H₄ | C₆H₅ |
| 26 | C₆H₅ | C₆H₅ | C₆H₅ |
| 27 | C₆H₅ | 4-CH₃-C₆H₄ | C₆H₅ |
| 28 | C₆H₅ | 4-SCH₃-C₆H₄ | C₆H₅ |
| 29 | 4-Cl-C₆H₄ | 4-Cl-C₆H₄ | 4-Cl-C₆H₄ |
| 30 | C₆H₅ | 4-Cl-C₆H₄ | C₆H₅ |
| 31 | C₆H₅ | C₆H₅ | C₆H₅ |
| 32 | C₆H₅ | C₆H₅ | C₆H₅ |

| compound | R¹ | R² | R³ | R⁴ | R⁵ | R⁶ |
|---|---|---|---|---|---|---|
| 25 | H | H | H | H | H | H |
| 26 | H | H | H | H | H | H |
| 27 | H | CH₃ | H | CH₃ | H | CH₃ |
| 28 | H | H | H | H | H | H |
| 29 | H | H | H | H | H | H |
| 30 | H | H | H | H | H | H |
| 31 | H | H | H | H | H | H |
| 32 | H | H | H | H | H | H |

TABLE 5

| compound | Ar¹ | Ar² | Ar³ |
|---|---|---|---|
| 33 | 4-Br-C₆H₄– | C₆H₅– | 4-Br-C₆H₄– |
| 34 | 4-Br-C₆H₄– | C₆H₅– | C₆H₅– |
| 35 | 4-Cl-C₆H₄– | 4-Cl-C₆H₄– | 4-Cl-C₆H₄– |
| 36 | 4-Cl-C₆H₄– | C₆H₅– | 4-Cl-C₆H₄– |
| 37 | 4-Cl-C₆H₄– | C₆H₅– | C₆H₅– |
| 38 | 4-Cl-C₆H₄– | C₆H₅– | 4-CH₃-C₆H₄– |
| 39 | 4-Cl-C₆H₄– | C₆H₅– | 4-CH₃-C₆H₄– |
| 40 | 4-Cl-C₆H₄– | C₆H₅– | 4-CH₃-C₆H₄– |

| compound | Ar⁴ | Ar⁵ | Ar⁶ |
|---|---|---|---|
| 33 | C₆H₅– | 4-Br-C₆H₄– | C₆H₅– |
| 34 | C₆H₅– | C₆H₅– | C₆H₅– |
| 35 | 4-Cl-C₆H₄– | 4-Cl-C₆H₄– | 4-Cl-C₆H₄– |
| 36 | C₆H₅– | 4-Cl-C₆H₄– | C₆H₅– |
| 37 | C₆H₅– | C₆H₅– | C₆H₅– |

TABLE 5-continued

| | Ar¹ | Ar² | Ar³ |
|---|---|---|---|
| 38 | phenyl | 4-CH₃-phenyl | phenyl |
| 39 | phenyl | 4-CH₃-phenyl | phenyl |
| 40 | 4-CH₃-phenyl | 4-CH₃-phenyl | 4-CH₃-phenyl |

| compound | R¹ | R² | R³ | R⁴ | R⁵ | R⁶ |
|---|---|---|---|---|---|---|
| 33 | H | H | H | H | H | H |
| 34 | H | H | H | H | H | H |
| 35 | H | CH₃ | H | CH₃ | H | CH₃ |
| 36 | H | CH₃ | H | CH₃ | H | CH₃ |
| 37 | H | CH₃ | H | CH₃ | H | CH₃ |
| 38 | H | CH₃ | H | CH₃ | H | CH₃ |
| 39 | H | CH₃ | H | CH₃ | H | CH₃ |
| 40 | H | CH₃ | H | CH₃ | H | CH₃ |

TABLE 6

| compound | Ar¹ | Ar² | Ar³ |
|---|---|---|---|
| 41 | 4-CF₃-phenyl | 4-CF₃-phenyl | 4-CF₃-phenyl |
| 42 | 4-CF₃-phenyl | phenyl | 4-CF₃-phenyl |
| 43 | 4-C₂F₅-phenyl | phenyl | 4-C₂F₅-phenyl |
| 44 | 4-C₂F₅-phenyl | phenyl | phenyl |
| 45 | 4-CCl₃-phenyl | phenyl | 4-CCl₃-phenyl |
| 46 | 4-CCl₃-phenyl | phenyl | phenyl |
| 47 | 4-CF₃-phenyl | phenyl | 4-CF₃-phenyl |
| 48 | 4-CF₃-phenyl | phenyl | phenyl |

TABLE 6-continued

| compound | Ar⁴ | Ar⁵ | Ar⁶ |
|---|---|---|---|
| 41 | –C₆H₄–CF₃ | –C₆H₄–CF₃ | –C₆H₄–CF₃ |
| 42 | –C₆H₅ | –C₆H₄–CF₃ | –C₆H₅ |
| 43 | –C₆H₅ | –C₆H₄–C₂F₅ | –C₆H₅ |
| 44 | –C₆H₅ | –C₆H₅ | –C₆H₅ |
| 45 | –C₆H₅ | –C₆H₄–CCl₃ | –C₆H₅ |
| 46 | –C₆H₅ | –C₆H₅ | –C₆H₅ |
| 47 | –C₆H₅ | –C₆H₄–CF₃ | –C₆H₅ |
| 48 | –C₆H₅ | –C₆H₅ | –C₆H₅ |

| compound | R¹ | R² | R³ | R⁴ | R⁵ | R⁶ |
|---|---|---|---|---|---|---|
| 41 | H | H | H | H | H | H |
| 42 | H | H | H | H | H | H |
| 43 | H | H | H | H | H | H |
| 44 | H | H | H | H | H | H |
| 45 | H | H | H | H | H | H |
| 46 | H | H | H | H | H | H |
| 47 | H | CH₃ | H | CH₃ | H | CH₃ |
| 48 | H | CH₃ | H | CH₃ | H | CH₃ |

It is possible that the first hole transport layer in the anode side includes the compound represented by the above general formula (I) whilst the second hole transport layer in the cathode side includes aromatic ternary amine which has been known and is selectable from the materials disclosed in Japanese patent publication No. 6-32307, Japanese laid-open patent publication No. 5-234681, Japanese patent publication No. 7-110940, Japanese laid-open patent publication No. 5-239455, and Japanese laid open patent publication No. 6-312982.

If an anode interface layer is provided between the anode and the first hole transport layer in the above novel organic thin film electroluminescent device in accordance with the present invention, then the anode interface layer may include a known condensed multi-ring compound. For example, porphyrin compounds disclosed in Japanese patent publication No. 64-7635 are available. Other condensed multi-ring compounds are available such as spiro compounds, perylene compounds, azo compounds, quinone compounds, indigo compounds, polymethine compounds, acridine compounds, and quinacridone compounds.

As a luminescent material, known organic fluorescents are available such as anthracene compounds, 8-quinolinole metal complexes disclosed in Japanese laid-open patent publication No. 59-194393, distyrylallylene derivatives disclosed in Japanese laid-open patent publications Nos. 2-247278 and 5-17765. Those organic fluorescents may be used alone. It is also possible that other organic fluorescents are doped in a luminescent body. For example, coumarin derivatives, dicyanomethylenepyran derivatives, perylene derivatives disclosed in Japanese laid-open patent publication No. 63-264692 and quinacridone derivatives disclosed in Japanese laid-open patent publication No. 5-70773 are useful dopants. The electroluminescent layer may be grown by known methods such as evaporation and application thereof.

The compound represented by the above general formula (I) is used in order to provide a high stability to the organic thin film in the organic thin film electroluminescent device. Any modifications to the layers other than the organic film including the compound represented by the above general formula (I) may be made. For example, the electroluminescent emitter region may comprise a layer of luminescent host or in place may comprises a layer doped with a luminescent dopant. The organic film including the compound represented by the above general formula (I) may include a luminescent material. The electron transport region may be provided or may not be provided. The anode and cathode may be made of one selected from the known materials.

As illustrated in FIG. 1, the novel organic thin film electroluminescent device may comprise a multi-layered structure as follows. An anode 12 is provided on a glass substrate 11. A hole transport layer 13 is provided on the anode 12. An emitter layer 14 is provided on the hole transport layer 13. An electron transport layer 15 is provided on the emitter layer 14. A cathode 16 is provided on the electron transport layer 15.

Figure 2:
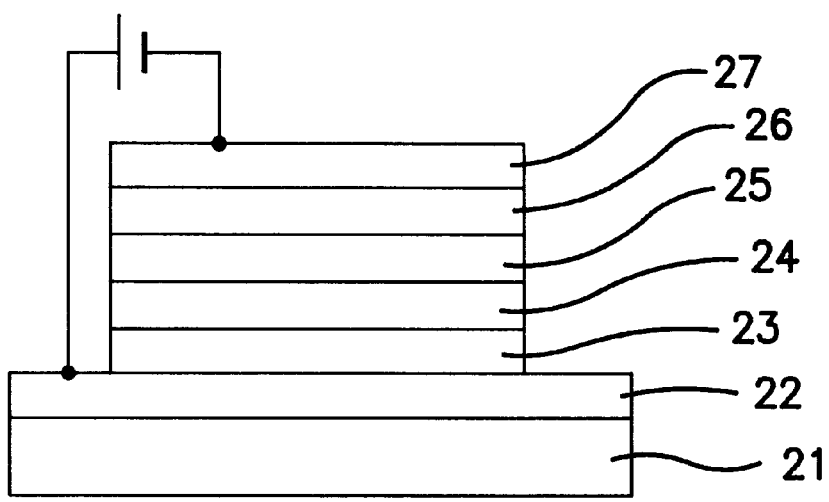
FIG. 2 is a cross sectional elevation view illustrative of another novel organic thin film electroluminescent device in accordance with the present invention.

Alternatively, as illustrated in FIG. 2, the novel organic thin film electroluminescent device may comprise a multi-layered structure as follows. An anode 22 is provided on a glass substrate 21 A first hole transport layer 23 is provided on the anode 22. A second hole transport layer 24 is provided on the first hole transport layer 23. An emitter layer 25 is provided on the second hole transport layer 24. An electron transport layer 26 is provided on the emitter layer 25. A cathode 27 is provided on the electron transport layer 26.

EXAMPLES

Example 1

An indium tin oxide film was grown on a glass substrate by a sputtering method to form an anode which has a resistance of 20 Ω/□. A hole transport layer of the compound 1 on the above tables with a thickness of 50 nanometers was grown on the anode by a resistance heating vacuum evaporation method. An emitter layer of tris(8-hydroxyquinolynole) aluminum as the following compound "a" with a thickness of 60 nanometers was grown on the hole transport layer by a resistance heating vacuum evaporation method. A MgAg film with thickness of 200 nanometers was grown on the emitter layer by a resistance heating vacuum evaporation method, where Mg:Ag evaporation rate is 10:1.

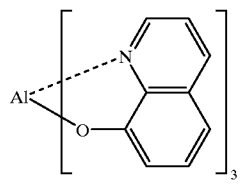

The luminescence characteristics of the device were measured in atmosphere. A green light emission with a high brightness from tris-(8-hydroxyquinolynole) aluminum was observed. The luminescence was caused at a constant current density of 6 mA/cm$^2$. The initial luminance was 165 cd/m$^2$. Even 500 hours was past from the luminance commencement, plane emission was still maintained at a luminescence of 132 cd/m$^2$. Even 1000 hours was past from the luminance commencement, the luminescence was higher than a half value of the initial luminance of 165 cd//m$^2$.

Comparative Example 1

An indium tin oxide film was grown on a glass substrate by a sputtering method to form an anode which has a resistance of 20 Ω/□. A hole transport layer of N,N'-diphenyl-N,N'-bis(3-methylphenyl)-1,1'-biphenyl-4,4'-diamine with a thickness of 50 nanometers was grown on the anode. An emitter layer of tris-(8- hydroxyquinolynole) aluminum with a thickness of 60 nanometers was grown on the hole transport layer by a resistance heating vacuum evaporation method. A MgAg film with thickness of 200 nanometers was grown on the emitter layer by a resistance heating vacuum evaporation method, where Mg:Ag evaporation rate is 10:1.

The luminescence characteristics of the device were measured in atmosphere. A green light emission with a high brightness from tris-(8-hydroxyquinolynole) aluminum was observed. The luminescence was caused at a constant current density of 6 mA/cm$^2$. The initial luminance was 175 cd/m$^2$. When 410 hours was past from the luminance commencement, plane emission was dropped down to a luminescence of 82 cd/m$^2$ and the device was broken.

Examples 2 Through 7

The device was prepared in the same manner as in Example 1 except for the kind of compound for the hole transport layer. The luminescence characteristics of the device were measured in atmosphere. A green light emission with a high brightness from tris-8-hydroxyquinolynole) aluminum was observed. The luminescence was caused at a constant current density of 6 mA/cm$^2$. The initial luminance and the post luminance after 500 hours were measured and are shown on the following Table 7.

TABLE 7

| Example | Hole Transport Layer | Initial luminance | Post luminance after 500 hr |
|---------|---------------------|-------------------|------------------------------|
| 2 | compound 2 | 143 cd/m$^2$ | 101 cd/m$^2$ |
| 3 | compound 4 | 151 cd/m$^2$ | 110 cd/m$^2$ |
| 4 | compound 7 | 162 cd/m$^2$ | 109 cd/m$^2$ |
| 5 | compound 9 | 150 cd/m$^2$ | 124 cd/m$^2$ |
| 6 | compound 17 | 117 cd/m$^2$ | 84 cd/m$^2$ |
| 7 | compound 29 | 105 cd/m$^2$ | 88 cd/m$^2$ |

Example 8

An indium tin oxide film was grown on a glass substrate by a sputtering method to form an anode which has a resistance of 20 Ω/□. A first hole transport layer of the compound 1 on the above tables with a thickness of 30 nanometers was grown on the anode by a resistance heating vacuum evaporation method. A second hole transport layer of the following compound "b" with a thickness of 20 nanometers was grown on the first hole transport layer by a resistance heating vacuum evaporation method. An emitter layer of tris-(8-hydroxyquinolynole) aluminum as the above compound "a" with a thickness of 60 nanometers was grown on the second hole transport layer by a resistance heating vacuum evaporation method. A MgAg film with thickness of 200 nanometers was grown on the emitter layer by a resistance heating vacuum evaporation method, where Mg:Ag evaporation rate is 10:1.

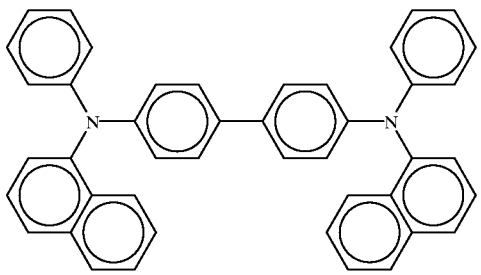

The luminescence characteristics of the device were measured in atmosphere. A green light emission with a high brightness from tris-(8-hydroxyquinolynole) aluminum was observed. The luminescence was caused at a constant current density of 6 mA/cm$^2$. The initial luminance was 226 cd/m$^2$. Even 500 hours was past from the luminance commencement, plane emission was still maintained at a luminescence of 191 cd/m$^2$.

Examples 9 THROUGH 14

The device was prepared in the same manner as in Example 8 except for the kind of compound for the first hole transport layer. The luminescence characteristics of the device were measured in atmosphere. A green light emission with a high brightness from tris-(8-hydroxyquinolynole) aluminum was observed. The luminescence was caused at a constant current density of 6 mA/cm$^2$. The initial luminance and the post luminance after 500 hours were measured and are shown on the following Table 8.

TABLE 8

| Example | Hole Transport Layer | Initial luminance | Post luminance after 500 hr |
|---|---|---|---|
| 9 | compound 2 | 197 cd/m$^2$ | 169 cd/m$^2$ |
| 10 | compound 4 | 204 cd/m$^2$ | 161 cd/m$^2$ |
| 11 | compound 7 | 200 cd/m$^2$ | 182 cd/m$^2$ |
| 12 | compound 9 | 212 cd/m$^2$ | 175 cd/m$^2$ |
| 13 | compound 17 | 189 cd/m$^2$ | 125 cd/m$^2$ |
| 14 | compound 29 | 175 cd/m$^2$ | 110 cd/m$^2$ |

Example 15

An indium tin oxide film was grown on a glass substrate by a sputtering method to form an anode which has a resistance of 20 Ω/□. A hole transport layer with a thickness of 50 nanometers was grown on the anode by a resistance heating vacuum evaporation method, wherein both the compound 1 on the above tables and poly(N-vinylcarbazole) at 1:1 weight ratio were solved into tetrahydrofurane at 1% by weight to prepare a coating material for dip coating thereof and subsequent drying at 80° C. for 1 hour thereby to form the hole transport layer. An emitter layer of tris-(8-hydroxyquinolynole) aluminum as the compound "a" with a thickness of 60 nanometers was grown on the hole transport layer by a resistance heating vacuum evaporation method. A MgAg film with thickness of 200 nanometers was grown on the emitter layer by a resistance heating vacuum evaporation method, where Mg:Ag evaporation rate is 10:1.

The luminescence characteristics of the device were measured in atmosphere. A green light emission with a high brightness from tris-(8-hydroxyquinolynole) aluminum was observed. The luminescence was caused at a constant current density of 6 mA/cm$^2$. The initial luminance was 154 cd/m$^2$. Even 500 hours was past from the luminance commencement, plane emission was still maintained at a luminescence of 131 cd/m$^2$.

Example 16

An indium tin oxide film was grown on a glass substrate by a sputtering method to form an anode which has a resistance of 20 Ω/□. A hole transport layer with a thickness of 50 nanometers was grown on the anode by a resistance heating vacuum evaporation method, wherein both the compound 2 on the above tables and the above compound "b" were co-evaporated at 4:1 in ratio of evaporation rate by the resistance heating vacuum evaporation method. An emitter layer of tris-(8-hydroxyquinolynole) aluminum as the compound "a" with a thickness of 60 nanometers was grown on the hole transport layer by a resistance heating vacuum evaporation method. A MgAg film with thickness of 200 nanometers was grown on the emitter layer by a resistance heating vacuum evaporation method, where Mg:Ag evaporation rate is 10:1.

The luminescence characteristics of the device were measured in atmosphere. A green light emission with a high brightness from tris-(8-hydroxyquinolynole) aluminum was observed. The luminescence was caused at a constant current density of 6 mA/cm$^2$. The initial luminance was 220 cd/m$^2$. Even 500 hours was past from the luminance commencement, plane emission was still maintained at a luminescence of 178 cd/m$^2$.

Example 17

An indium tin oxide film was grown on a glass substrate by a sputtering method to form an anode which has a resistance of 20 Ω/□. A hole transport layer with a thickness of 50 nanometers was grown on the anode by a resistance heating vacuum evaporation method, wherein the compound 1 on the above tables was evaporated by the resistance heating vacuum evaporation method. An emitter layer with a thickness of 50 nanometers was grown on the hole transport layer, wherein tris-(8-hydroxyquinolynole) aluminum as the compound "a" and DCM as the following compound "c" were co-evaporated at 100:2 in ratio of evaporation rate by the resistance heating vacuum evaporation method. A MgAg film with thickness of 200 nanometers was grown on the emitter layer by a resistance heating vacuum evaporation method, where Mg:Ag evaporation rate is 10:1.

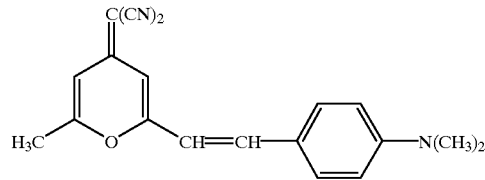

The luminescence characteristics of the device were measured in atmosphere. A green light emission with a high brightness from tris-(8-hydroxyquinolynole) aluminum was observed. The luminescence was caused at a constant current density of 6 mA/cm$^2$. The initial luminance was 352 cd/m$^2$. Even 500 hours was past from the luminance commencement, plane emission was still maintained at a luminescence of 296 cd/m$^2$.

Example 18

An indium tin oxide film was grown on a glass substrate by a sputtering method to form an anode which has a resistance of 20 Ω/□. An anode interface layer of copper phthalocyanine as the following compound "d" with a thickness of 5 nanometers was grown on the anode by the resistance heating vacuum evaporation method. A hole transport layer of the compound 4 on the above tables with a thickness of 50 nanometers was grown on the anode interface layer by the resistance heating vacuum evaporation method. An emitter layer of tris-(8- hydroxyquinolynole) aluminum as the above compound "a" with a thickness of 60 nanometers was grown on the hole transport layer by the resistance heating vacuum evaporation method. A MgAg film with thickness of 200 nanometers was grown on the emitter layer by the resistance heating vacuum evaporation method, where Mg:Ag evaporation rate is 10:1.

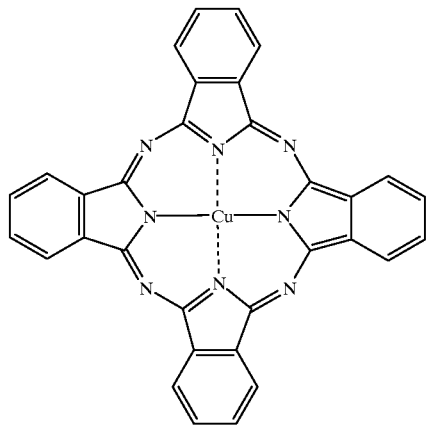

The luminescence characteristics of the device were measured in atmosphere. A green light emission with a high brightness from tris-(8-hydroxyquinolynole) aluminum was observed. The luminescence was caused at a constant current density of 6 mA/cm². The initial luminance was 160 cd/m². Even 500 hours was past from the luminance commencement, plane emission was still maintained at a luminescence of 141 cd/m².

Example 19

An indium tin oxide film was grown on a glass substrate by a sputtering method to form an anode which has a resistance of 20 Ω/□. An anode interface layer of quinacridone as the following compound "e" with a thickness of 5 nanometers was grown on the anode by the resistance heating vacuum evaporation method. Thereafter, the substrate is dipped into tetrahydrofurane for 10 seconds and then dried at 80° C. for 1 hour. A hole tort layer of the compound 4 on the above tables with a thickness of 50 nanometers was grown on the anode interface layer by the resistance heating vacuum evaporation method. An emitter layer of tris-(8-hydroxyquinolynole) aluminum as the above compound "a" with a thickness of 60 nanometers was grown on the hole transport layer by the resistance heating vacuum evaporation method A MgAg film with thickness of 200 nanometers was grown on the emitter layer by the resistance heating vacuum evaporation method, where Mg:Ag evaporation rate is 10:1.

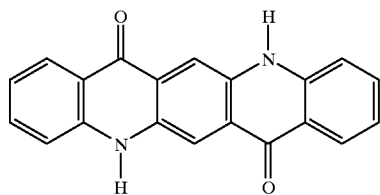

The luminescence characteristics of the device were measured in atmosphere. A green light emission with a high brightness from tris(8-hydroxyquinolynole) aluminum was observed. The luminescence was caused at a constant current density of 6 mA/cm². The initial luminance was 166 cd/m². Even 500 hours was past from the luminance commencement, plane emission was still maintained at a luminescence of 153 cd/m².

From the above examples and comparative example, it can be understood that the organic thin film electroluminescent device in accordance with the present invention is much superior in durability than the organic thin film electroluminescent device of the comparative example.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An organic thin film electroluminescent device which has at least an organic thin film provided between an anode and a cathode,
wherein the organic thin film includes a compound which is represented by a general formula (I):

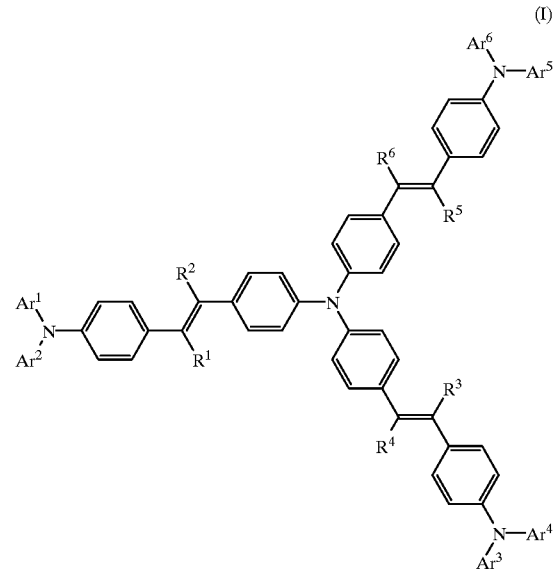

where $Ar^1$, $Ar^2$, $Ar^3$, $Ar^4$, $Ar^5$, and $Ar^6$ are selected from the group consisting of non-substituted phenyl groups and phenyl groups substituted with at least a substituent which is selected from the group consisting of alkyl groups having 1–4 carbon atoms, alkoxyl groups having 1–4 carbon atoms, amino groups, alkyl amino groups having 1–4 carbon atoms, dialkyl amino groups having 1–4 carbon atoms, alkyl thio groups having 1–4 carbon atoms, halogens, and halogeno alkyl groups having 1–4 carbon atoms, and $R^1$, $R^2$, $R^3$, $R^4$, $R^5$, and $R^6$ are selected from the group consisting of hydrogen and methyl groups.

2. The organic thin film electroluminescent device as claimed in claim 1, wherein the phenyl group is substituted with a plurality of the same substituents as each other.

3. The organic thin film electroluminescent device as claimed in claim 1, wherein the phenyl group is substituted with a plurality of different substituents from each other.

4. The organic thin film electroluminescent device as claimed in claim 1, wherein the organic thin film electroluminescent device has a hole transport region which includes the compound which is represented by a general formula (I).

5. The organic thin film electroluminescent device as claimed in claim 4, wherein the hole transport region comprises a first hole transport layer positioned in an anode side and a second hole transport layer positioned in a cathode side, and wherein the first hole transport layer includes the compound which is represented by a general formula (I).

6. The organic thin film electroluminescent device as claimed in claim 5, wherein the second hole transport layer includes an aromatic ternary amine compound.

7. The organic thin film electroluminescent device as claimed in claim 1, wherein the organic thin film comprises an anode interface layer in contact with the anode and a hole transport layer in contact with the anode interface layer, and wherein the hole transport layer includes the compound which is represented by a general formula (I) whilst the anode interface layer includes a condensed multi-ring compound.

8. The organic thin film electroluminescent device as claimed in claim 1, wherein the compound represented by the general formula (I) is included in the organic thin film at 10–100% by weight.

9. The organic thin film electroluminescent device as claimed in claim 1, wherein a thickness of the organic thin film including the compound represented by the general formula (I) is preferably 1–500 nanometers.

10. The organic thin film electroluminescent device as claimed in claim 1, wherein a low molecular weight compound represented by the general formula (I) is dispersed in a high molecular binder for formation of the organic film.

11. An organic film in an electroluminescent device, wherein the organic film includes a compound which is represented by a general formula (I):

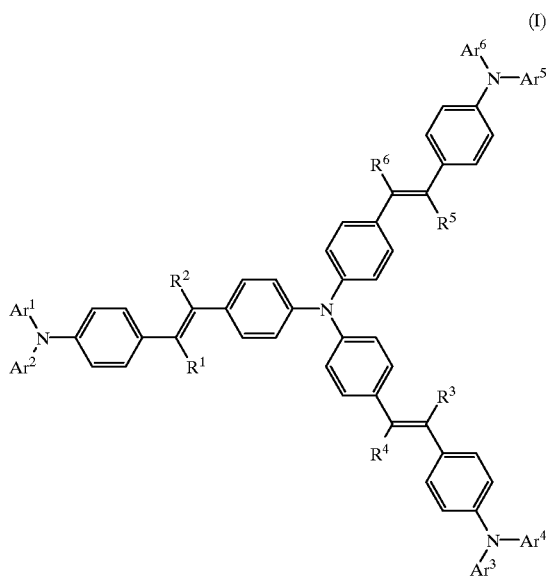

(I)

where $Ar^1$, $Ar^2$, $Ar^3$, $Ar^4$, $Ar^5$, and $Ar^6$ are selected from the group consisting of non-substituted phenyl groups and phenyl groups substituted with at least a substituent which is selected from the group consisting of alkyl groups having 1–4 carbon atoms, alkoxyl groups having 1–4 carbon atoms, amino groups, alkyl amino groups having 1–4 carbon atoms, dialkyl amino groups having 1–4 carbon atoms, alkyl thio groups having 1–4 carbon atoms, halogens, and halogeno alkyl groups having 1–4 carbon atoms, and $R^1$, $R^2$, $R^3$, $R^4$, $R^5$, and $R^6$ are selected from the group consisting of hydrogen and methyl groups.

12. The organic film as claimed in claim 11, wherein the phenyl group is substituted with a plurality of the same substituents as each other.

13. The organic film as claimed in claim 11, wherein the phenyl group is substituted with a plurality of different substituents from each other.

14. The organic film as claimed in claim 11, wherein the organic film is provided in a hole transport region which includes the compound which is represented by a general formula (I).

15. The organic film as claimed in claim 14, wherein the hole transport region comprises a first hole transport layer and a second hole transport layer positioned, and wherein the first hole transport layer includes the compound which is represented by a general formula (I).

16. The organic thin film electroluminescent device as claimed in claim 15, wherein the second hole transport layer includes an aromatic ternary amine compound.

17. The organic film as claimed in claim 11, wherein the organic film comprises an interface layer in contact with the anode and a hole transport layer in contact with the interface layer, and wherein the hole transport layer includes the compound which is represented by a general formula (I) whilst the interface layer includes a condensed multi-ring compound.

18. The organic film as claimed in claim 11, wherein the compound represented by the general formula (I) is included in the organic thin film at 10–100% by weight.

19. The organic film as claimed in claim 11, wherein a thickness of the organic film including the compound represented by the general formula (I) is 1–500 nanometers.

20. The organic film as claimed in claim 11, wherein a low molecular weight compound represented by the general formula (I) is dispersed in a high molecular binder for formation of the organic film.

* * * * *